United States Patent
Hori et al.

(10) Patent No.: US 11,082,025 B2
(45) Date of Patent: Aug. 3, 2021

(54) JOINED BODY OF PIEZOELECTRIC MATERIAL SUBSTRATE AND SUPPORT SUBSTRATE

(71) Applicant: NGK INSULATORS, LTD., Nagoya (JP)

(72) Inventors: Yuji Hori, Owariasahi (JP); Tatsuro Takagaki, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/096,199

(22) Filed: Nov. 12, 2020

(65) Prior Publication Data
US 2021/0067129 A1    Mar. 4, 2021

Related U.S. Application Data

(63) Continuation of application No. PCT/JP2019/005613, filed on Feb. 15, 2019.

(30) Foreign Application Priority Data

May 16, 2018 (JP) .............................. JP2018-094461

(51) Int. Cl.
| | | |
|---|---|---|
| H03H 9/02 | (2006.01) | |
| H01L 41/312 | (2013.01) | |
| H03H 3/08 | (2006.01) | |
| H03H 9/25 | (2006.01) | |

(52) U.S. Cl.
CPC ....... *H03H 9/02574* (2013.01); *H01L 41/312* (2013.01); *H03H 3/08* (2013.01); *H03H 9/02559* (2013.01); *H03H 9/25* (2013.01)

(58) Field of Classification Search
CPC ....................... H03H 9/02574; H03H 9/02559
USPC ...... 310/313 R, 313 A, 313 B, 313 C, 313 D
See application file for complete search history.

(56) References Cited

U.S. PATENT DOCUMENTS

| 8,729,771 B2 | 5/2014 | Kobayashi et al. |
| 2004/0226162 A1 | 11/2004 | Miura et al. |
| 2012/0126669 A1 | 5/2012 | Kobayashi et al. |
| 2013/0234805 A1 | 9/2013 | Takahashi |

(Continued)

FOREIGN PATENT DOCUMENTS

| CN | 206878791 U | 1/2018 |
| JP | 3774782 B2 | 12/2004 |

(Continued)

OTHER PUBLICATIONS

Yoshikaju Zikuhara et al. Sequential Activation Process of oxygen RIE and nitrogen Radical for LiTaO3 and Si Wafer Bonding, ECS Transactions, 3 (6) 91-98 (2006) (9 pages).

(Continued)

*Primary Examiner* — Derek J Rosenau
(74) *Attorney, Agent, or Firm* — Flynn Thiel, P.C.

(57) ABSTRACT

A bonded body includes a supporting substrate; a piezoelectric material substrate composed of a material selected from the group consisting of lithium niobate, lithium tantalate and lithium niobate-lithium tantalate; and a bonding layer bonding the supporting substrate and the piezoelectric material substrate and contacting a main surface of the piezoelectric material substrate. The bonding layer includes a void extending from the piezoelectric material substrate to the supporting substrate.

12 Claims, 9 Drawing Sheets

(56) References Cited

U.S. PATENT DOCUMENTS

| | | |
|---|---|---|
| 2013/0285768 A1 | 10/2013 | Watanabe et al. |
| 2014/0145558 A1* | 5/2014 | Hori .................... H03H 9/0595 |
| | | 310/313 R |
| 2017/0179371 A1 | 6/2017 | Kitamura et al. |
| 2017/0256701 A1 | 9/2017 | Kishimoto |
| 2018/0175283 A1 | 6/2018 | Akiyama et al. |
| 2019/0036008 A1 | 1/2019 | Tai et al. |
| 2019/0036009 A1 | 1/2019 | Tai et al. |
| 2019/0288661 A1 | 9/2019 | Akiyama et al. |

FOREIGN PATENT DOCUMENTS

| | | |
|---|---|---|
| JP | 5814727 B2 | 4/2012 |
| JP | 2014086400 A | 5/2014 |
| JP | 5910763 B2 | 4/2015 |
| JP | 2015145054 A | 8/2015 |
| JP | 2016225537 A | 12/2016 |
| WO | 2010114602 A1 | 10/2010 |
| WO | 2011013553 A1 | 2/2011 |
| WO | 2017047604 A1 | 3/2017 |
| WO | 2017163722 A1 | 9/2017 |
| WO | 2017163723 A1 | 9/2017 |
| WO | 2018016314 A1 | 1/2018 |

OTHER PUBLICATIONS

T. Plach et al. Mechanisms for room temperature direct wafer bonding, Journal of Applied Physics 113, 094905 (2013) (8 pages).

International Search Report with English Translation issued in corresponding International Application No. PCT/JP2019/005613 dated Apr. 23, 2019 (5 pages).

Written Opinion of International Searching Authority issued in corresponding International Application No. PCT/JP2019/005613 dated Apr. 23, 2019 (5 pages).

Chinese Office Action issued in corresponding Chinese Application No. 201980019317.0 dated Mar. 23, 2021 (7 pages).

Office Action from German Patent Office issued in corresponding German Application No. 11 2019 002 458.2 with English Translation dated Apr. 6, 2021 (16 pages).

* cited by examiner

JOINED BODY OF PIEZOELECTRIC MATERIAL SUBSTRATE AND SUPPORT SUBSTRATE

CROSS-REFERENCE TO RELATED APPLICATIONS

This is a continuation of PCT/JP2019/005613, filed Feb. 15, 2019, which claims priority to Japanese Application No. JP2018-094461, filed May 16, 2018, the entire contents of which are hereby incorporated by reference.

TECHNICAL FIELD

The present invention relates to a bonded body of a piezoelectric material substrate and supporting substrate.

BACKGROUND ARTS

It has been widely used an SOI substrate composed of a high resistance Si/SiO$_2$ thin film/Si thin film, for realizing a high-performance semiconductor device. Plasma activation is applied for realizing the SOI substrate. This is because the bonding can be realized at a relatively low temperature (400° C.). It is proposed a composite substrate composed of similar Si/SiO$_2$ thin film/piezoelectric thin film for improving the performance of a piezoelectric device (patent document 1). According to patent document 1, the piezoelectric material substrate composed of lithium niobate or lithium tantalate and silicon substrate with a silicon oxide layer formed thereon are activated by ion activation method, followed by the bonding.

It is proposed a filter having a multi-layered structure including a single or plural dielectric film at the bonding interface (Patent document 2). However, there is hardly known information concerning the bonding technique for realizing the structure of lithium tantalate/silicon oxide/silicon.

It is described, in patent document 3, that lithium tantalate and sapphire or a ceramic material are bonded through a silicon oxide layer by plasma activation method.

Further, according to a surface acoustic wave filter by adhering lithium tantalate and sapphire through a silicon oxide layer, it is known that bulk wave is generated at the bonding interface and unnecessary response is observed in transmission and high frequency bands. For preventing this, it is proposed the technique of introducing a roughened surface at the bonding interface to scatter the bulk wave and to suppress the unnecessary response. At this time, it is published that the roughened surface is filled with an inorganic material and then polished to provide a flattened surface (Patent document 4).

NON-PATENT DOCUMENTS (Non-patent document 1) ECS Transactions, 3 (6) 91-98 (2006)
(Non-patent document 2) J. Applied Physics 113, 094905 (2013)

PATENT DOCUMENTS (Patent document 1) Japanese Patent Publication No. 2016-225537A
(Patent document 2) Japanese Patent No. 5910763B
(Patent document 3) Japanese Patent No. 3774782B
(Patent document 4) Japanese Patent Publication No. 2012-085286A (Japanese Patent No. 5814727B)

SUMMARY OF THE INVENTION

However, different kinds of materials having different thermal expansion coefficients are introduced into the bonding interface, meaning that a stress is generated during a heating step included in wafer processing. Thus, after the bonded body is subjected to heat treatment, there is a problem that the fracture of the bonded body or separation of the piezoelectric material substrate frequently occurs due to the stress. Further, as the different kinds of the materials are filled densely into the roughness on the bonding surface of the piezoelectric material substrate, resulting in new cause of reflection so that the unnecessary wave may not be sufficiently suppressed.

An object of the present invention is, in bonding a piezoelectric material substrate to a supporting substrate through a bonding layer, to prevent the separation of the piezoelectric material substrate when the thus obtained bonded body is subjected to a heat treatment.

The present invention provides a bonded body comprising:
a supporting substrate;
a piezoelectric material substrate comprising a material selected from the group consisting of lithium niobate, lithium tantalate and lithium niobate-lithium tantalate; and
a bonding layer bonding the supporting substrate and the piezoelectric material substrate and contacting a bonding surface of the piezoelectric material substrate,
wherein the bonding layer comprises a void extending from the piezoelectric material substrate toward the supporting substrate.

When a roughened surface is formed on a main surface of the piezoelectric material substrate and a bonding layer composed of silicon oxide, tantalum pentoxide or the like is formed on the roughened surface, the inventors researched the film-forming conditions of the bonding layer. Until now, it has been considered that a dense bonding layer is necessarily film-formed for assuring the bonding strength and it has been applied the conditions for generating the dense film at a relatively low rate. However, in this case, as the piezoelectric material substrate is thinned by processing and then subjected to the heat treatment, the thinned piezoelectric material substrate tends to be separated from the supporting substrate.

As the inventors have researched the microstructure of the dense bonding layer for solving the problem, voids or cracks were not specifically observed in the bonding layer. Thus, they changed the idea and tried to raise the film-forming rate of the bonding layer. It is thus found that voids are generated mainly from the recesses as starting points of the piezoelectric material substrate. Then, in the case that such voids are generated in the bonding layer, it was found that the separation of the piezoelectric material substrate is suppressed even when the piezoelectric material substrate is thinned by processing, followed by the heat treatment. The present invention is thus made.

Although it is not clear the reason why such considerable effects are obtained, it is considered that the mechanical stress applied by the processing and thermal stress applied by the heating are appropriately dispersed by the voids extending from the side of the piezoelectric material substrate toward the side of the supporting substrate.

Figure 1A:
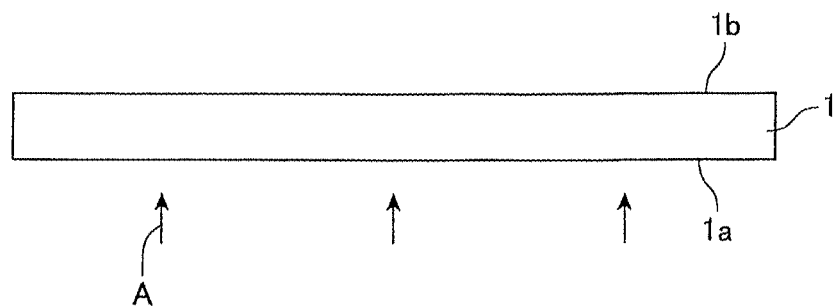
FIG. 1(a) shows the state that a main surface 1a of a piezoelectric material substrate 1 is processed, FIG. 1(b)
Figure 1B:
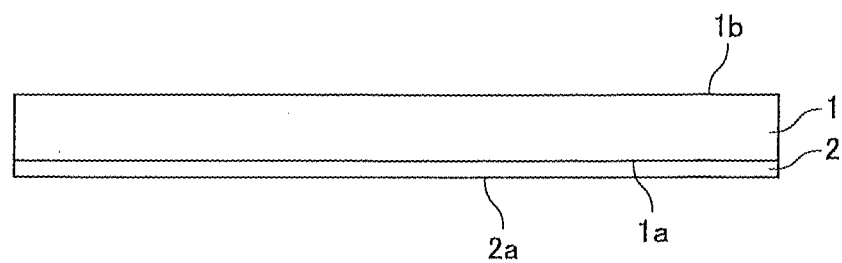
Figure 1C:
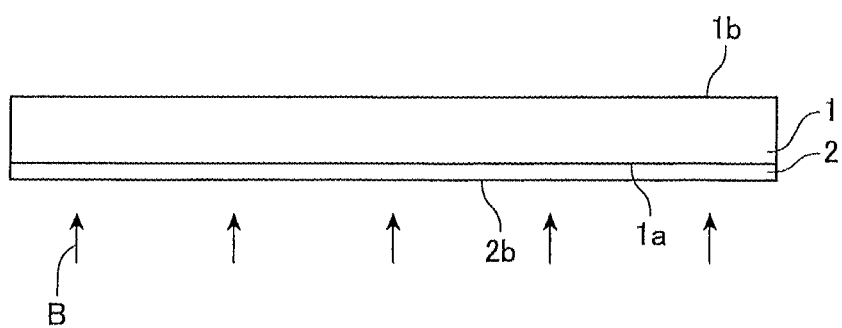

shows the state that a bonding layer 2 is provided on the main surface 1*a* of the piezoelectric material substrate 1, and FIG. 1(*c*) shows the state that plasma B is irradiated onto a bonding surface of the bonding layer 2 to activate the bonding surface.

Figure 2A:
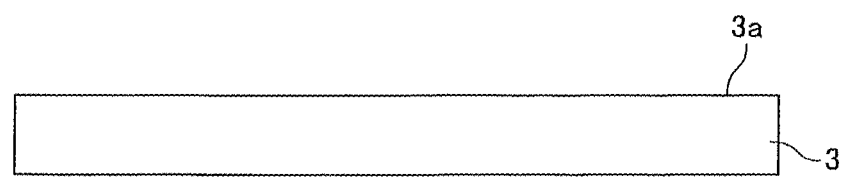
Figure 2B:
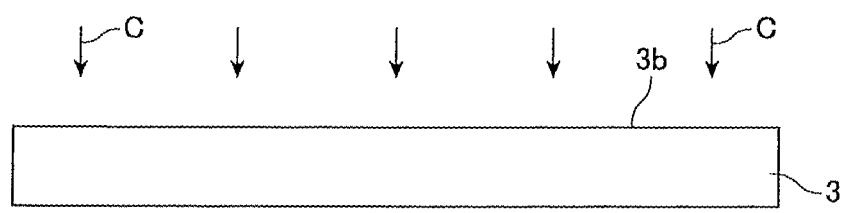

FIG. 2(*a*) shows a supporting substrate 3, and FIG. 2(*b*) shows the state that a bonding surface 3*b* of the supporting substrate 3 is activated.

Figure 3A:
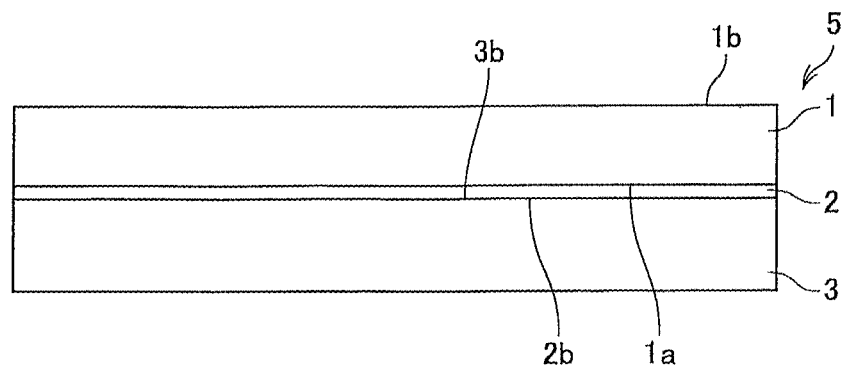
Figure 3B:
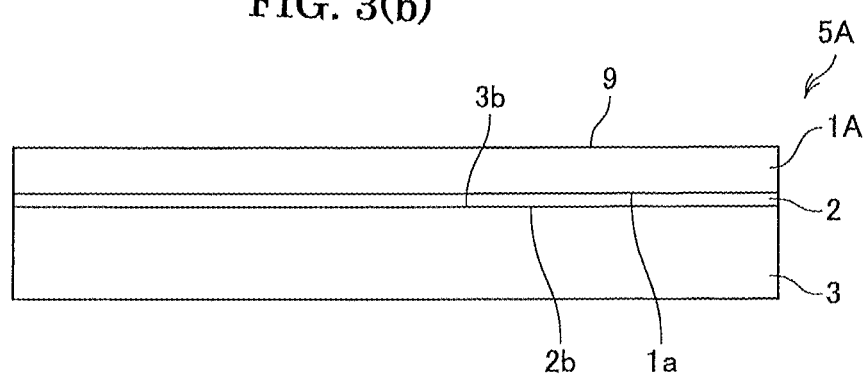

FIG. 3(*a*) shows a bonded body 5 of the piezoelectric material substrate 1 and supporting substrate 3, FIG. 3(*b*) shows the state that a piezoelectric material substrate 1A of a bonded body 5A is thinned by processing, and FIG. 3(*c*) shows an acoustic wave device 6.

Figure 4A:
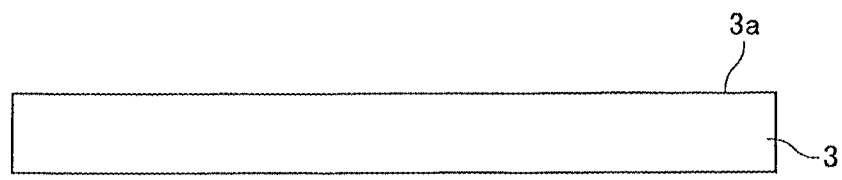
Figure 4B:
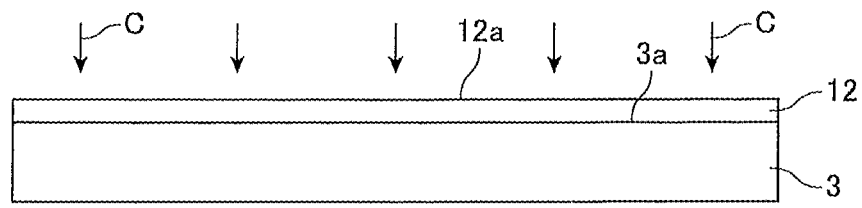

FIG. 4(*a*) shows the supporting substrate 3, and FIG. 4(*b*) shows the state that a bonding surface 12*a* of an intermediate layer 12 on the supporting substrate 3 is activated.

Figure 5A:
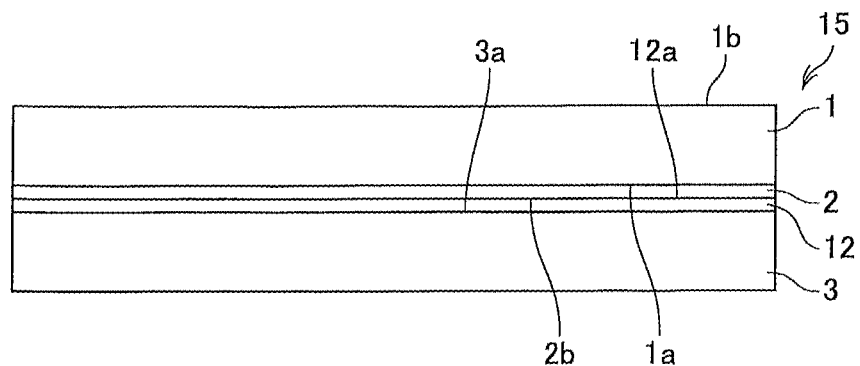
Figure 5B:
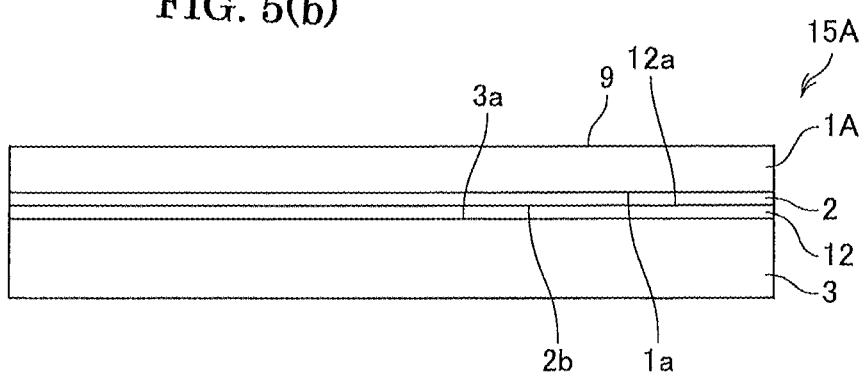
Figure 5C:
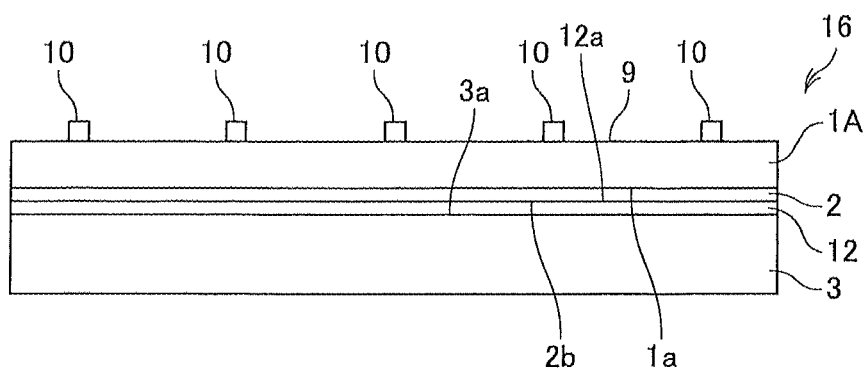

FIG. 5(*a*) shows a bonded body 15 of the piezoelectric material substrate 1 and supporting substrate 3, FIG. 5(*b*) shows the state that a piezoelectric material substrate 1A of the bonded body 15A is thinned by processing, and FIG. 5(*c*) shows an acoustic wave device 16.

Figure 6:
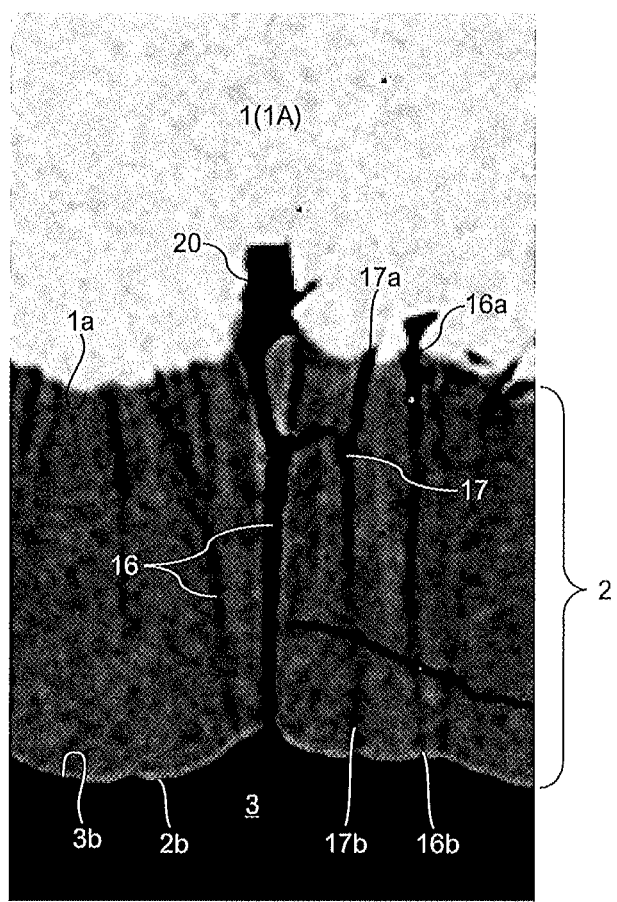

FIG. 6 shows a photograph showing an enlarged view of a bonding layer according to an inventive example.

Figure 7:
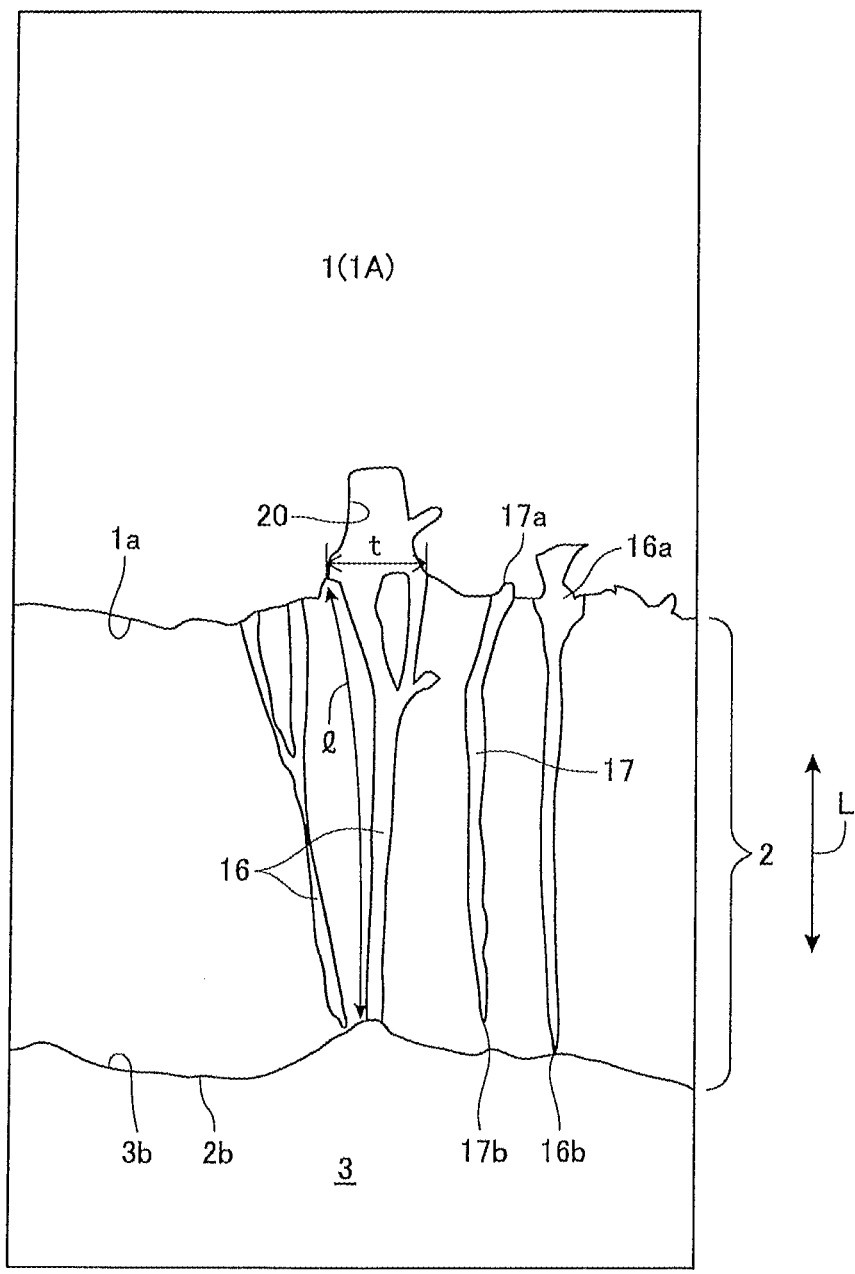

FIG. 7 is a diagram illustrating and corresponding with the photograph of FIG. 6.

Figure 8:
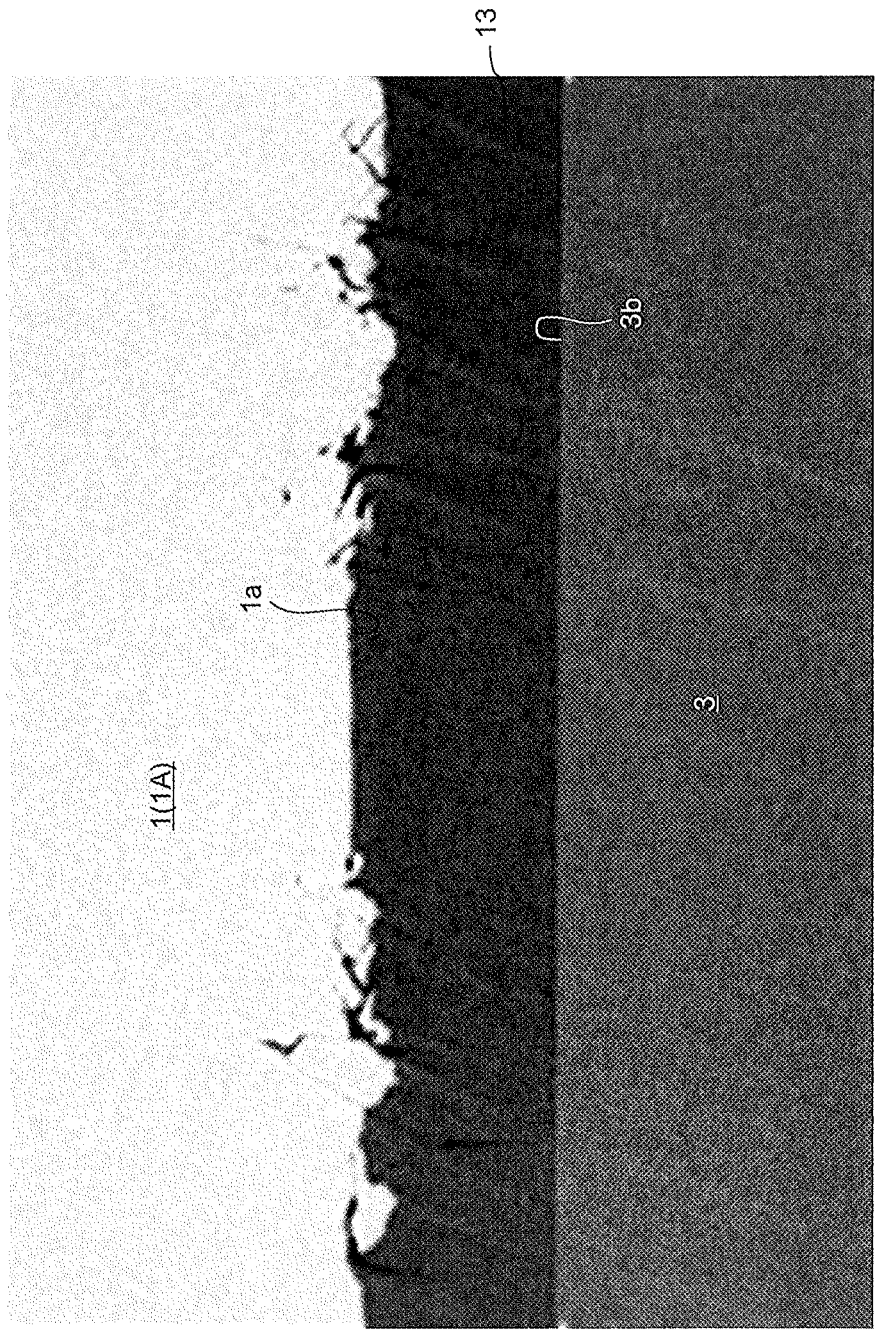

FIG. 8 is a photograph showing an enlarged view of a bonding layer according to a comparative example.

Figure 9:
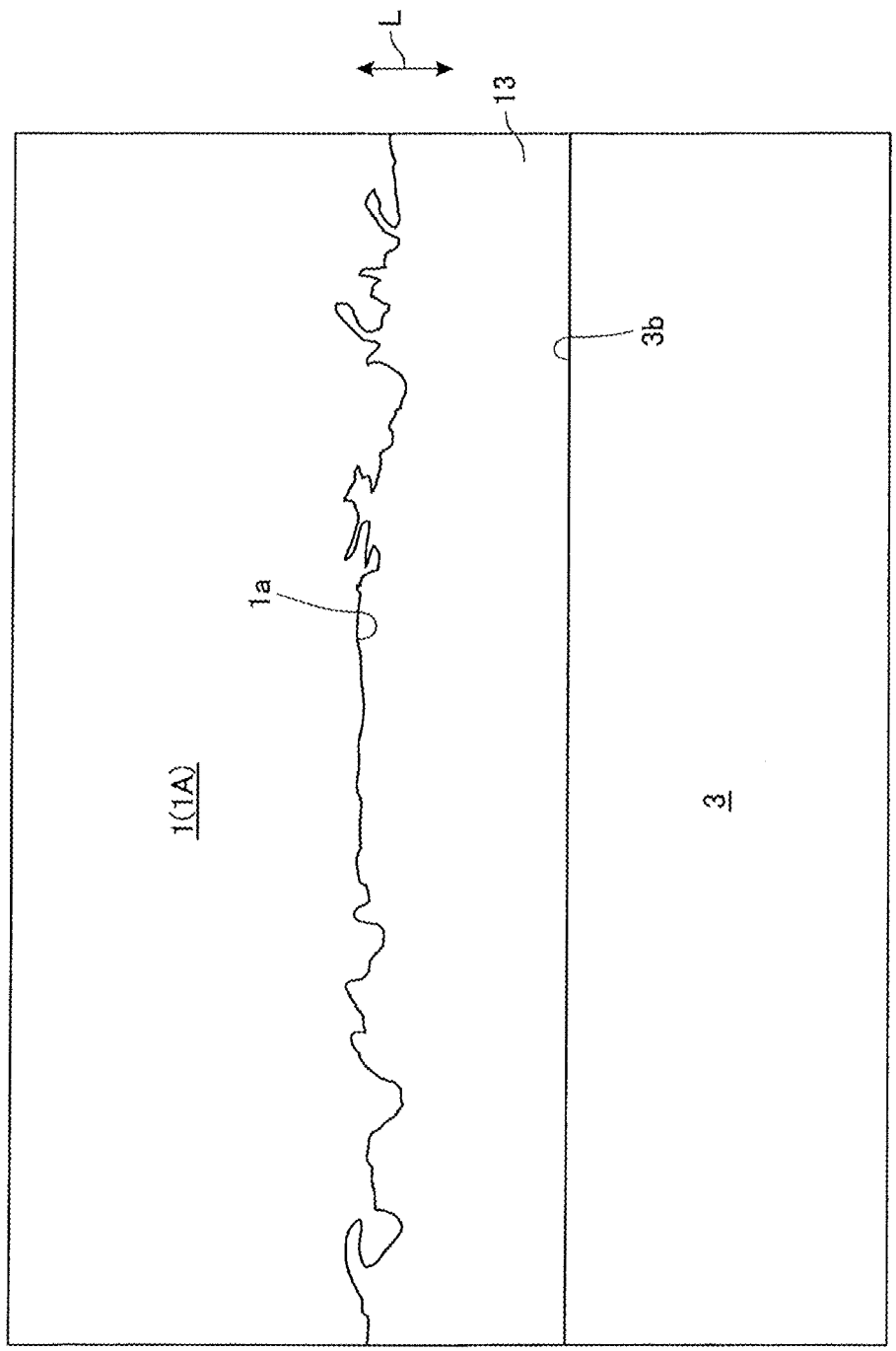

FIG. 9 is a diagram illustrating and corresponding with the photograph shown in FIG. 8.

EMBODIMENTS FOR CARRYING OUT THE INVENTION

The present invention will be described in detail, appropriately referring to drawings.

First, as shown in FIG. 1(*a*), it is prepared a piezoelectric material substrate 1 having a pair of main surfaces 1*a* and 1*b*. Processing A is then applied onto the main surface 1*a* to perform the roughening. Then, as shown in FIG. 1(*b*), a bonding layer 2 was film-formed on the main surface 1*a* of the piezoelectric material substrate 1. The surface 2*a* of the bonding layer 2 is subjected to CMP polishing for the sake of obtaining a mirror surface. Then, as shown in FIG. 1(*c*), plasma is irradiated onto the surface 2*a* of the bonding layer 2 as arrows B to obtain an activated bonding surface 2*b*.

Further, as shown in FIG. 2(*a*), it is prepared a supporting substrate 3 having a main surface 3*a*. Then, plasma is irradiated onto the main surface of the supporting substrate 3 as arrows C to perform the surface activation to form an activated bonding surface 3*b*.

Then, the activated bonding surface 2*b* of the bonding layer 2 on the piezoelectric material substrate and the activated bonding surface 3*b* of the supporting substrate 3 are contacted and directly bonded with each other to obtain a bonded body 5 shown in FIG. 3(*a*).

At the state, electrodes may be provided on the piezoelectric material substrate 1. However, preferably, as shown in FIG. 3(*b*), a main surface 1*b* of the piezoelectric material substrate 1 is processed to thin the substrate 1 to obtain a thinned piezoelectric material substrate 1A, providing a bonded body 5A. 9 represents a processed surface. Then, as shown in FIG. 3(*c*), predetermined electrodes 10 are formed on the processed surface 9 of the piezoelectric material substrate 1A of the bonded body 5A to obtain an acoustic wave device 6.

Further, an intermediate layer may be provided between the bonding layer 2 and supporting substrate 3. FIGS. 4 and 5 relate to this embodiment.

According to the present example, as shown in FIG. 1(*a*), it is prepared a piezoelectric material substrate 1 having a pair of main surfaces 1*a* and 1*b*. Processing A is then performed on the main surface 1*a* to perform the roughening. Then, as shown in FIG. 1(*b*), a bonding layer 2 is film-formed on the main surface 1*a* of the piezoelectric material substrate 1. The surface of the bonding layer 2 is subjected to CMP polishing for obtaining a mirror surface. Then, as shown in FIG. 1(*c*), plasma is irradiated onto the bonding surface of the bonding layer 2 as arrows B to obtain a surface-activated bonding surface 2*b*.

Further, as shown in FIG. 4(*a*), it is prepared a supporting substrate 3 having a main surface 3*a*. Then, as shown in FIG. 4(*b*), an intermediate layer 12 is formed on the main surface 3*a* of the supporting substrate 3, and plasma is irradiated onto the surface of the intermediate layer 12 as arrow C to perform the surface activation to form a surface-activated bonding surface 12*a*.

Then, the activated bonding surface 2*b* of the bonding layer 2 on the piezoelectric material substrate and the activated bonding surface 12*a* of the intermediate layer 12 on the supporting substrate 3 are contacted and directly bonded with each other, to obtain a bonded body 15 shown in FIG. 5(*a*).

At the state, electrodes may be provided on the piezoelectric material substrate 1. However, preferably, as shown in FIG. 5(*b*), a main surface 1*b* of the piezoelectric material substrate 1 is processed to thin the substrate 1 to obtain a thinned piezoelectric material substrate 1A, providing a bonded body 15A. 9 represents a processed surface. Then, as shown in FIG. 5(*c*), predetermined electrodes 10 are formed on the processed surface 9 of the piezoelectric material substrate 1A of the bonded body 5A to obtain an acoustic wave device 16.

Alternatively, after the bonding layer 2 is film-formed, the intermediate layer 12 may subsequently film-formed on the bonding layer 2. In this case, CMP polishing is performed onto the surface of the intermediate layer 12 to obtain a bonding surface (mirror surface). Plasma is irradiated onto the thus obtained bonding surface to activate it. The surface of the supporting substrate is then subjected to plasma activation, followed by direct bonding with the bonding surface of the intermediate layer.

According to the present invention, it is provided, in the bonding layer 2, an elongate void extending from the piezoelectric material substrate 1(1A) toward the supporting substrate 3. For example, as shown in a photograph of cross section of FIG. 6 and schematic illustrating diagram of FIG. 7, it is formed, in the bonding layer 2 between the piezoelectric material substrate 1(1A) and supporting substrate, voids 16 and 17 extending from the piezoelectric material substrate 1(1A) toward the supporting substrate 3 are formed.

According to the present embodiment, it is understood that the respective voids 16 and 17 are extended from the main surface 1*a* of the piezoelectric material substrate 1(1A) and conform to the morphology of the roughness (particularly recesses) on the main surface 1*a*. 16*a* and 17*a* represent end parts of the voids 16 and 17, respectively, on the side of the piezoelectric material substrate. Further, some voids 16 reach the bonding surface 2*b* of the bonding layer 2 on the side of the supporting substrate, and some voids 17 do not reach the bonding surface 2*b* of the bonding layer 2 and is terminated within the bonding layer 2. Further, 16*b* and 17*b* are ends of the respective voids 16 and 17, respectively, on the side of the bonding surface 2b.

The void means a space which is not filled with the material forming the bonding layer. Further, the presence and shape of the void are observed and measured by cutting the bonded body (wafer) and by observing the cross section by cutting by an SEM (scanning type electron microscope). The measurement conditions are shown below.

SEM system: "Ultra55" supplied by Carl Zeiss AG
Acceleration voltage: 2 kV
magnification: 4000 folds According to a preferred embodiment, a recess 20 is provided on the main surface 1a of the piezoelectric material substrate 1(1A), and voids 16 and 17 are communicated with the recess 20. When the bonding layer is film-formed on the piezoelectric material substrate, the layer is film-formed in conform to the morphology of the main surface of the piezoelectric material substrate, so that such morphology tends to be generated. However, crystal may be filled into boundaries of the voids and recesses during the crystal growth so that the ends 16a and 17a of the voids may be distant from the recesses 20.

According to a preferred embodiment, the voids penetrate through the bonding layer in the thickness direction L. In this case, the respective ends 16a of the voids 16 reach the main surface 1a of the piezoelectric material substrate, and the ends 16b of the void 16 on the opposite side reach the bonding surface 2b of the bonding layer 2. The presence of the voids having such morphology is preferred on the viewpoint of preventing the separation of the piezoelectric material substrate.

The thickness direction L of the bonding layer means the direction perpendicular to the main surface 1a of the piezoelectric material substrate. However, the morphology of the main surface 1a is to be approximated to a flat plane and fine roughness is to be ignored.

Preferably, the void is elongated approximately in the thickness direction L of the bonding layer. It is not necessary that the void is extended in parallel with the thickness direction L over the whole length of the void, and the void may be curved or deformed, or a plurality of the lines of the voids may be communicated with each other. Further, the void may preferably be an elongate void. Further, the specific shape is not particularly limited, and may be a stripe, steak, entasis shape or the like, and these shapes may be further curved or bent.

Further, (width "t" at the end of the void on the side of the piezoelectric material substrate)/(total length "1" of the void) may preferably be 0.02 or larger and more preferably be 0.03 or larger. Further, (width "t" at the end of the void on the side of the piezoelectric material substrate)/(total length "1" of the void) may preferably be 0.08 or smaller and more preferably be 0.05 or smaller.

Further, the total length "1" of the void means a length (distance) of a total route of the void from the end on the side of the piezoelectric material substrate to the end on the side of the supporting substrate. Further, the width "t" at the end of the void on the side of the piezoelectric material substrate means a width of the void viewed in parallel with the interface between the piezoelectric material substrate and supporting substrate.

According to a preferred embodiment, the bonding layer 2 contacts the main surface 2a of the supporting substrate 3. FIGS. 1 to 3 relate to this embodiment.

Further, according to a preferred embodiment, the intermediate layer 12 is present between the bonding layer 2 and supporting substrate 3. FIGS. 4 and 5 relate to this embodiment. Such intermediate layer may be composed of a single layer alone or plural layers.

The respective constituents of the present invention will be described in the order.

Although the material of the supporting substrate 3 is not particularly limited, the material is preferably selected from the group consisting of silicon, quartz, sialon, mullite, sapphire and translucent alumina. It is thus possible to further improve the temperature characteristics of frequency of the piezoelectric wave device 6 or 16.

Although the method of film-forming the bonding layer and intermediate layer is not particularly limited, sputtering, chemical vapor deposition method (CVD) and vapor deposition may be listed.

Although the material of the bonding layer 2 is not particularly limited, as far as the surface activation treatment is possible, a metal oxide film is preferred, and it is particularly preferred a material selected from the group consisting of silicon oxide and tantalum pentoxide. Further, as the method of surface activation treatment, an appropriate method may be selected depending on the material of the bonding layer applied. Such surface activation method includes plasma activation and FAB (Ar atomic beam).

Although the material of the intermediate layer 12 is not particularly limited, as far as the surface activation treatment is possible, a metal oxide film is preferred, and it is particularly preferred a material selected from the group consisting of silicon oxide and tantalum pentoxide. However, it is preferred to select the material of the intermediate layer different from the material of the bonding layer.

The thickness of the bonding layer 2 may preferably be 0.5 μm or larger, more preferably be 1.0 μm or larger and most preferably be 2.5 μm or larger, on the viewpoint of the present invention. Further, the thickness of the bonding layer 2 may preferably be 10 μm or smaller, more preferably be 7 μm or smaller and most preferably be 5 μm or smaller.

The piezoelectric material substrate 1 used in the present invention is made lithium tantalate (LT) single crystal, lithium niobate (LN) single crystal or lithium niobate-lithium tantalate solid solution. As the materials have high propagation speeds of a surface acoustic wave and large electro-mechanical coupling factors, it is preferred for use in a surface acoustic wave device for high frequency and wide-band frequency applications.

Further, although the normal direction of the main surface 1a of the piezoelectric material substrate 1 is not particularly limited, for example, in the case that the piezoelectric material substrate 1 is made of LT, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. In the case that the piezoelectric material substrate 1 is made of LN, (i) it is preferred to use the substrate rotated from Z-axis toward—Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate 1 is not particularly limited, for example, the diameter may be 100 to 200 mm and thickness may be 0.15 to 1 μm.

Further, when the main surface 1b of the piezoelectric material substrate 1 is subjected to roughening process, lapping is preferred. It is more preferred that the lapping is performed by applying rough abrasive grains of GC #1000 or GC #2500. As the thus processed roughened surface is subjected to measurement by "New View 7300" supplied by Zygo Co. Ltd., Ra of 100 to 300 nm and Rmax value of 1.4 to 4.0 μm were shown. Alternatively, blasting may be applied to obtain the similar roughened surface.

Then, plasma is irradiated onto the bonding surface of the bonding layer 2 on the piezoelectric material substrate 1, bonding surface of the supporting substrate 3 and bonding surface of the intermediate layer 12 on the supporting substrate 3 at a temperature of 150° C. or lower to activate the bonding surfaces. Although it is preferred to irradiate nitrogen plasma on the viewpoint of the present invention, it is possible to obtain the bonded body of the invention even when oxygen plasma is irradiated.

The pressure during the surface activation may preferably be 100 Pa or lower and more preferably be 80 Pa or lower. Further, the atmosphere may be composed of nitrogen only, or oxygen only, or mixture of nitrogen and oxygen.

The temperature during the irradiation of plasma is made 150° C. or lower. It is thus possible to obtain the bonded body having a high bonding strength and without deterioration of crystallinity. On the viewpoint, the temperature during the plasma irradiation is made 150° C. or lower, and is preferably made 100° C. or lower.

Further, the energy of the irradiated plasma may preferably be 30 to 150 W. Further, a product of the energy of the irradiated plasma and a time for the irradiation may preferably be 0.12 to 1.0 Wh.

The bonding surfaces of the substrates after the plasma treatment were contacted with each other at room temperature. At this time, although the substrates may be treated under vacuum, the substrates may preferably be contacted in atmosphere.

In the case that the surface activation by the argon atomic beam is performed, it is preferred to use a system described in JP 2014-086400A to generate the argon atomic beam, which is irradiated. That is, it is used a high-speed atomic beam source of saddle field type as the beam source. Then, an inert gas is introduced into a chamber and a high voltage is applied onto electrodes from a direct current electric source. By this, electric field of saddle field type generated between the electrode (positive electrode) and a housing (negative electrode) causes motion of electrons, e, so that argon atomic and ion beams are generated. Among the beams reached at a grid, the ion beam is neutralized at the grid, and the beam of argon atoms is emitted from the high-speed atomic beam source. In the activation step by beam irradiation, the voltage may preferably be made 0.5 to 2.0 kV, and the current may preferably be made 50 to 200 mA.

According to a preferred embodiment, the bonding surfaces of the bonding layer on the piezoelectric material substrate, of the supporting substrate and of the intermediate layer on the supporting substrate are subjected to flattening process, before the surface activation treatment. The method of flattening the respective bonding surfaces includes lapping, chemical mechanical polishing (CMP) and the like. Further, the flattened surfaces may preferably have Ra of 1 nm or less and more preferably have Ra of 0.3 nm or less.

Then, the bonding surface of the bonding layer on the piezoelectric material substrate and the bonding layer of the supporting substrate 3 or bonding layer of the intermediate layer are contacted and bonded with each other. Thereafter, annealing treatment may preferably be performed to improve the bonding strength. The temperature during the annealing treatment may preferably be 100° C. or higher and 300° C. or lower.

The bonded bodies 5, 5A, 15 and 15A of the present invention may preferably be applied as acoustic wave devices 6 and 16. That is, it is an acoustic wave device including the bonded body of the present invention and electrodes provided on the piezoelectric material substrate.

Specifically, as the acoustic wave device 6 or 16, a surface acoustic wave device, Lamb wave-type device, thin film resonator (FBAR) or the like is known. For example, the surface acoustic wave device is produced by providing an input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric material substrate. By applying high frequency signal on the IDT electrode on the input side, electric field is generated between the electrodes, so that the surface acoustic wave is oscillated and propagated on the piezoelectric material substrate. Then, the propagated surface acoustic wave is taken out as an electrical signal from the IDT electrodes on the output side provided in the direction of the propagation.

A material forming the electrode 10 of the piezoelectric material substrate 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Inventive Example A

Figure 3C:
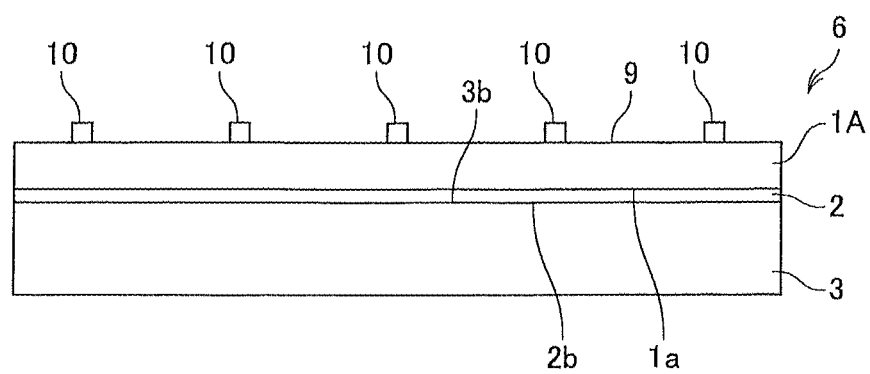

It was produced the acoustic wave device 6 shown in FIG. 3(c), according to the method described referring to FIGS. 1 to 3.

Specifically, one main surface 1b of the 42Y cut-X-propagation $LiTaO_3$ substrate (piezoelectric material substrate) 1 having a thickness of 250 μm was polished into a mirror surface, and the other main surface 1a was lapped with GC #1000. Further, it was prepared a high-resistance (>2 kΩ·cm) Si(100) substrate (supporting substrate) 3 having a thickness of 0.23 mm. The sizes of the respective substrates were 150 mm.

The bonding layer 2 composed of a silicon oxide film having a thickness of 6 um was film-formed on the main surface (roughened surface) 1a of the piezoelectric material substrate 1 by using a sputtering system "RAS-1100C" (supplied by SHINCHRON CO., LTD.). The film-forming conditions were as follows.

Bias electric power: 6000 W
Ar gas flow: 100 sccm
Electric power of micro wave: 1500 W
$O_2$ gas flow rate: 200 sccm
rate: 0.3 nm/sec
Pressure in chamber during film-formation: 0.1 Pa The thus film-formed silicon oxide was subjected to CMP processing so as to obtain a flatness required for the bonding.

The surface roughness of the bonding layer after the polishing was measured by AFM (Atomic force microscope) and Ra was proved to be 0.4 nm, indicating that it was obtained a mirror surface sufficient for the bonding.

The bonding surface 2a of the bonding layer 2 on the piezoelectric material substrate 1 and bonding layer 3a of the supporting substrate 3 were then subjected to cleaning and surface activation. Specifically, it was performed ultrasonic cleaning by pure water, followed by drying of the substrate surfaces by spin drying. The supporting substrate 3 after the cleaning was introduced into a plasma activation chamber, and the bonding surface 3a of the supporting substrate was activated under nitrogen gas plasma at 30° C. Further, the piezoelectric material substrate 1 was similarly introduced into the plasma activation chamber, and the bonding surface 2a of the bonding layer 2 was subjected to surface activation by nitrogen gas plasma at 30° C. The time period for the surface activation was made 40 seconds, and energy was made 100 W. The same ultrasonic cleaning and spin drying as described above were performed again, for removing particles adhered during the surface activation.

The positioning of the respective substrates was then performed and the activated bonding surfaces of the respective substrates were contacted with each other at room temperature. The substrates were contacted with the piezoelectric material substrate 1 positioned upside. As a result, it was observed the state that the adhesion of the substrates with each other was spreading (so-called bonding wave), indicating that good preliminary bonding was realized. The bonded body was then charged into an oven filled with nitrogen atmosphere and held at 120° C. for 10 hours, for improving the bonding strength.

The surface 1b of the piezoelectric material substrate 1 of the bonded body after the heating was subjected to grinding, lapping and CMP processing so that the thickness of the piezoelectric material substrate 1A reached 20 μm. The thus obtained bonded body was charged into an oven at 300° C. for 2 hours and then taken out, for confirming the heat resistance of the bonded body, and it was confirmed that cracks or separation of the piezoelectric material substrate 1A was not observed.

Further, FIG. 6 shows a photograph of the cross section of the thus obtained bonded body taken by the SEM system and condition described above, and FIG. 7 illustrates the explanation (the explanation was described above). Further, l/t was 0.04 to 0.13.

Inventive Example B

The material of the bonding layer was changed to tantalum pentoxide in the inventive example A. Further, Ar atomic beam was applied for the surface activation instead of the plasma. As a result, it was obtained the similar results as those of the inventive example A.

Inventive Example C

The material of the piezoelectric material substrate 1 was changed to lithium niobate in the inventive example A. As a result, it was obtained the similar results as those of the inventive example A.

Comparative Example A

The bonded body was produced according to the same procedure as that of the inventive example A. However, the bias electric power during the film-formation was lowered to the half, that is, from 6000 W to 3000 W and the rate of the film-formation was made about ½.

The bonded body was produced according to the same procedure as that of the inventive example 1, and the thus obtained bonded body was charged into an oven at 300° C. for 2 hours, and the bonded body was then taken out. As a result, the bonded body was fractured into powder.

Further, as the cross section of the bonded body was observed, as shown in FIGS. 8 and 9, the structure of the bonding layer 13 was very dense and it was not observed voids extending in the thickness direction L.

Comparative Example B

The material of the bonding layer 13 was changed to tantalum pentoxide in the comparative example A. Further, Ar atomic beam was applied for the surface activation as described above. As a result, it was obtained the similar results as those of the comparative example A.

The invention claimed is:

1. A bonded body comprising:
a supporting substrate;
a piezoelectric material substrate comprising a material selected from the group consisting of lithium niobate, lithium tantalate and lithium niobate-lithium tantalate; and
a bonding layer bonding said supporting substrate and said piezoelectric material substrate and contacting a main surface of said piezoelectric material substrate,
wherein said bonding layer comprises a void extending from said piezoelectric material substrate toward said supporting substrate, and
wherein a recess is provided on said main surface of said piezoelectric material substrate and said void is communicated with said recess.

2. The bonded body of claim 1, wherein said void penetrates said bonding layer in a direction of thickness of said bonding layer.

3. The bonded body of claim 1, wherein said bonding layer comprises a material selected from the group consisting of silicon oxide and tantalum pentoxide.

4. The bonded body of claim 1, wherein said bonding layer contacts a main surface of said supporting substrate.

5. The bonded body of claim 1, further comprising an intermediate layer between said bonding layer and said supporting substrate.

6. The bonded body of claim 1, wherein said piezoelectric material substrate has a thickness of 20 μm or smaller.

7. A bonded body comprising:
a supporting substrate;
a piezoelectric material substrate comprising a material selected from the group consisting of lithium niobate, lithium tantalate and lithium niobate-lithium tantalate; and
a bonding layer bonding said supporting substrate and said piezoelectric material substrate and contacting a main surface of said piezoelectric material substrate,
wherein said bonding layer comprises a void extending from said piezoelectric material substrate toward said supporting substrate, and
wherein said bonding layer comprises a material selected from the group consisting of silicon oxide and tantalum pentoxide.

8. The bonded body of claim 7, wherein said bonding layer contacts a main surface of said supporting substrate.

9. The bonded body of claim 7, further comprising an intermediate layer between said bonding layer and said supporting substrate.

10. The bonded body of claim 7, wherein said piezoelectric material substrate has a thickness of 20 μm or smaller.

11. A bonded body comprising:
a supporting substrate;

a piezoelectric material substrate comprising a material selected from the group consisting of lithium niobate, lithium tantalate and lithium niobate-lithium tantalate; and a bonding layer bonding said supporting substrate and said piezoelectric material substrate and contacting a main surface of said piezoelectric material substrate, wherein said bonding layer comprises a void extending from said piezoelectric material substrate toward said supporting substrate, and wherein said bonded body further comprises an intermediate layer between said bonding layer and said supporting substrate.

12. The bonded body of claim 11 wherein said piezoelectric material substrate has a thickness of 20 μm or smaller.

* * * * *